United States Patent [19]
Ikedo et al.

[11] Patent Number: 4,678,275
[45] Date of Patent: Jul. 7, 1987

[54] OPTICAL FIBER FOR INFRARED TRANSMISSION CONSISTING ESSENTIALLY OF HIGH PURITY MIXED CRYSTAL OF THALLIUM BROMIDE AND THALLIUM IODIDE

[75] Inventors: Masaru Ikedo, Ikoma; Masafumi Watari, Osaka; Yoshiaki Hayashi, Osaka; Osamu Yamamoto, Osaka; Hiroshi Tsutsui, Kyoto, all of Japan

[73] Assignee: Matsushita Electric Industrial Co., Ltd., Japan

[21] Appl. No.: 716,156

[22] Filed: Mar. 26, 1985

[30] Foreign Application Priority Data

Aug. 2, 1984 [JP] Japan .................. 59-163103

[51] Int. Cl.⁴ .................................. G02B 6/16
[52] U.S. Cl. ..................... 350/96.34; 350/96.30
[58] Field of Search ............ 350/96.29, 96.30, 96.31, 350/96.34

[56] References Cited

U.S. PATENT DOCUMENTS

| | | | |
|---|---|---|---|
| 4,253,731 | 3/1981 | Anderson et al. | 350/96.34 |
| 4,293,833 | 10/1981 | Popa | 333/239 |
| 4,451,116 | 5/1984 | Pinnow et al. | 350/96.34 |
| 4,504,298 | 3/1985 | Yokota et al. | 350/96.34 |
| 4,521,073 | 6/1985 | Murakami et al. | 350/96.3 X |

FOREIGN PATENT DOCUMENTS 0056262 7/1982 European Pat. Off. .

OTHER PUBLICATIONS

Krus et al., "Crystal Materials for Infrared Fibers", *Infrared Fibers* (0.8–12 $\mu$m), SPIE, vol. 266, Feb. 1981, pp. 72–77.
Optics Letters, vol. 6, No. 12, Dec. 1981, pp. 629–631, Optical Society of America, New York, US; S. Sakuragi et al.
"KRS-5 Optical Fibers Capable of Transmitting High-Power $CO_2$ Laser Beam", p. 629, column 1, line 11–17, 35–39.
Soviet Journal of Quantum Electronics, vol. 8, No. 2, Feb. 1981, pp. 239–240, American Institute of Physics, New York, US.
V. G. Artyushenko et al.: "Thallium Halide Fiber Waveguides for Middle Infrared Range", p. 239, column 2, lines 3–5.

*Primary Examiner*—John Lee
*Attorney, Agent, or Firm*—Lowe, Price, LeBlanc, Becker & Shur

[57] ABSTRACT

An optical fiber which is able to transmit high power infrared energy, and is flexible and long in life is described. The fiber consists essentially of a mixed crystal of 40 to 45 wt % of thallium bromide and the balance of thallium iodide, each having a purity not less than 99.9%. The fiber is free of any particles having a size not smaller than 1 $\mu$m.

7 Claims, 7 Drawing Figures

OPTICAL FIBER FOR INFRARED TRANSMISSION CONSISTING ESSENTIALLY OF HIGH PURITY MIXED CRYSTAL OF THALLIUM BROMIDE AND THALLIUM IODIDE

BACKGROUND OF THE INVENTION

1. Field of the Invention

This invention relates to optical fibers and more particularly, to infrared ray-transmittable fibers. The optical fibers of the invention are particularly suitable for energy transmission such as in laser works and laser scalpels.

2. Description of the Prior Art

In recent years, attempts have been made to utilize laser beams in various fields. For instance, carbon dioxide laser scalpels have been progressively developed in medical fields and effectively utilized. In the field of industrial machinery and tools, efforts have been made to apply laser beams to processing machines for cutting, marking, and trimming.

Aside from carbon dioxide lasers having an oscillation wavelength of 10.6 $\mu$m, other infrared lasers such as a carbon monoxide laser having an oscillation wavelength of 5 to 7 $\mu$m are also used. In order to effectively utilize these infrared laser beams having high power energy, there is a high demand for optical fibers having good flexibility and capable of transmitting high energy power.

Optical fibers for moderate infrared radiation were developed using various materials such as chalcogen compounds, fluorides, metal halides and the like. However, chalcogen compounds and fluorides have drawbacks: chalcogen compounds are not suitable for high power energy transmission; and fluoride compounds involve the problem that infrared beams attenuate at wavelengths over 7 $\mu$m. On the other hand, metal halides have a great possibility for use as an infrared fiber. For instance, there are known materials, called KRS-5, which are frequently used as optical parts for infrared radiation. These materials are permeable to radiation in the moderate infrared region covering a wavelength of from 0.5 to 30 $\mu$m, and have fairly good humidity resistance and mechanical strength. The KRS-5 materials are solid solutions of thallium bromide, TlBr, and thallium iodide, TlI, typical of which is a composition comprising 38 wt% of thallium bromide.

These materials are converted to fibers by a procedure which comprises heating the material at temperatures 100° to 200° C. lower than the melting point of the solid solution, KRS-5, and extruding under high pressure. Aside from the solid solutions, thallium chloride, thallium bromide, and thallium iodide are singly used for conversion to a fiber. In practice, the optical fibers obtained from these thallium halides have a diameter of from 0.3 to 1 mm. However, when high power over 30 W is transmitted to the optical fiber, the fiber tends to deteriorate within a relatively short period of time, and may be readily melted during use. Thus, high power transmission becomes impossible. We found that the deterioration was attributed to impurities such as metal oxides and chlorides and also to the size of the impurities contained in the starting thallium halide materials.

SUMMARY OF THE INVENTION

It is accordingly an object of the invention to provide optical fibers which are able to transmit infrared energy of high power and which have a long life.

It is another object of the invention to provide thallium halide optical fibers which have good flexibility.

It is a further object of the invention to provide thallium halide optical fibers which are particularly suitable as laser scalpels.

The optical fiber of the invention which is able to transmit high power infrared energy, and is flexible and long in life, consists essentially of a mixed crystal of 40 to 45 wt% of thallium bromide and the balance of thallium iodide, each having a purity not less than 99.9%. Impurity elements should be 10 ppm or less in total, and foreign matters derived from the impurity elements should have a size not largerr than 1 $\mu$m.

DETAILED DESCRIPTION AND EMBODIMENTS OF THE INVENTION

Fabrication and characteristic properties of an optical fiber according to the invention are described with reference to the accompanying drawings.

Figure 1:
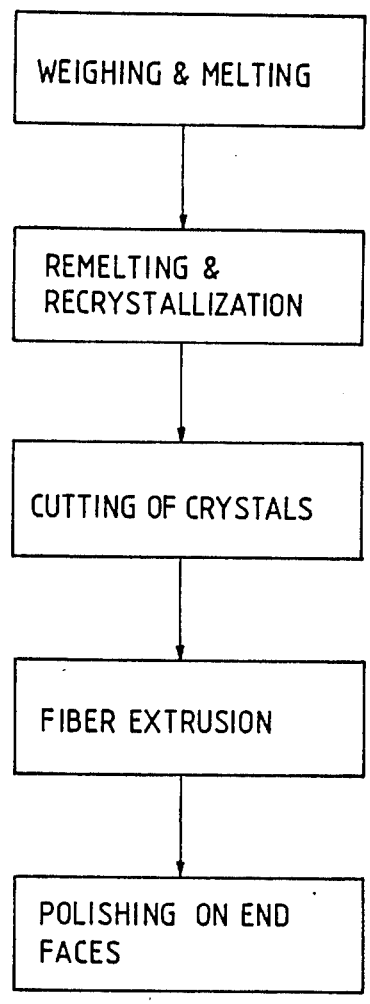
FIG. 1 is a flowchart showing a process of making an optical fiber for infrared rays according to the invention.

Reference is now made to FIG. 1 which illustrates a sequence of steps of fabricating the optical fiber. In the first step, starting thallium bromide and thallium iodide, each having a purity of 99.9% or higher are dried, weighed in an intended ratio, and melted. The mixture is again melted in an inert gas and recrystallized by a melt zone purification technique to purify the crystals so that the total content of impurities such as oxides and chlorides of Si, Al, Fe, Zn and Mg is reduced to below 10 ppm. The crystals are then cut to a suitable size and subjected to extrusion under conditions of a temperature of 200° to 300° C., an extrusion speed of several centimeters/minute, and a pressure of 7 to 10 tons/cm² to obtain a fiber. The thus obtained fiber is polished at opposite ends thereof to obtain an optical fiber for infrared transmission.

Figure 2:
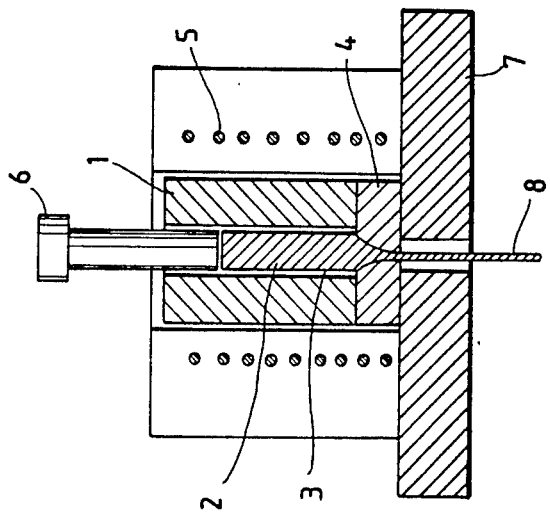
FIG. 2 is a schematic view of an extruder for thallium halide fibers.

FIG. 2 shows an apparatus A for extruding the crystals in the form of a fiber. The apparatus A has a die 1 which has a cavity 2, in which a mixed crystal 3 of thallium halides is contained. The die 1 has a nozzle or orifice 4 by which the diameter of the fiber is determined. The die 1 is surrounded by a heater 5. Reference numeral 6 denotes a press ram, reference numeral 7 denotes a die support, and reference numeral 8 is an extruded fiber.

In operation, an extrusion temperature is first set at a level of 200° to 300° C. After the temperature has been set at a predetermined level, the crystal material in the cavity is compressed under a pressure of 7 to 10 tons/cm$^2$ at a speed of several centimeters per minute as described before, thereby obtaining a fiber. The diameter of the fiber may be arbitrarily controlled using a nozzle whose diameter is from 0.05 to 1 mm.

Figure 3:
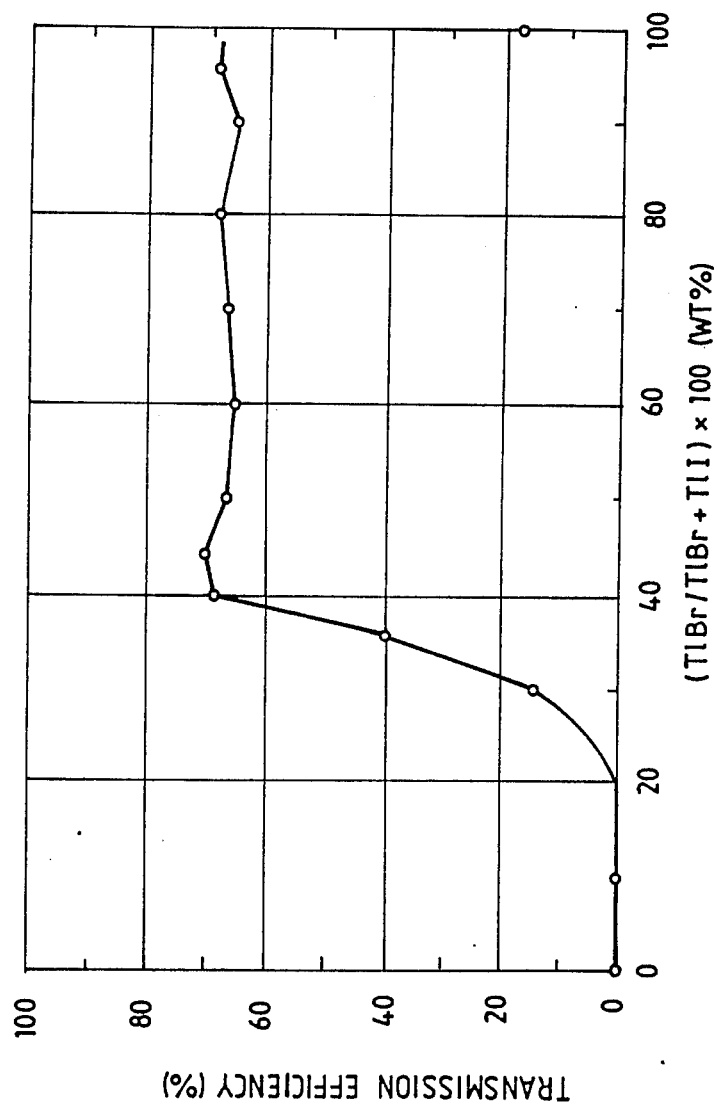
FIG. 3 is a graph showing the relation between transmission efficiency and content of thallium bromide in a a mixed crystal of thallium bromide and thallium iodide.

Optical fibers are made, in a manner as described above, using mixed crystals of thallium bromide and thallium iodide in different ratios. These fibers are subjected to measurement of a carbon dioxide laser transmission efficiency. In this measurement, fibers tested have a diameter of 0.5 mm and a length of 1 m. It will be noted that the transmission efficiency is a transmittance of the laser through an optical fiber with various losses including a total reflection loss at opposite ends, an absorption loss in the fiber, and a scattering loss at the interface. The results are shown in FIG. 3. From the figure, it will be seen that no carbon dioxide laser transmits through the one meter long fiber when thallium iodide alone is used. No transmission takes place up to 20 wt% of thallium bromide. The laser transmits at a TlBr concentration of 30 wt%. When the content of TlBr reaches 38 wt%, the transmission efficiency is as high as 70%. This efficiency remains substantially unchanged as the content of TlBr further increases. Howevr, the fiber of 100% thallium bromide is very soft, which makes it difficult to polish the fiber at the ends thereof. Thus, a correct measurement of transmittance is difficult.

It is to be noted that thallium bromide-thallium iodide crystals hve a refractive index as high as 2.3-2.4 and a theoretical reflection loss reaching 28%, so that a fiber having a transmission efficiency of 70 to 71% per meter is considered as a good optical fiber.

Figure 4:
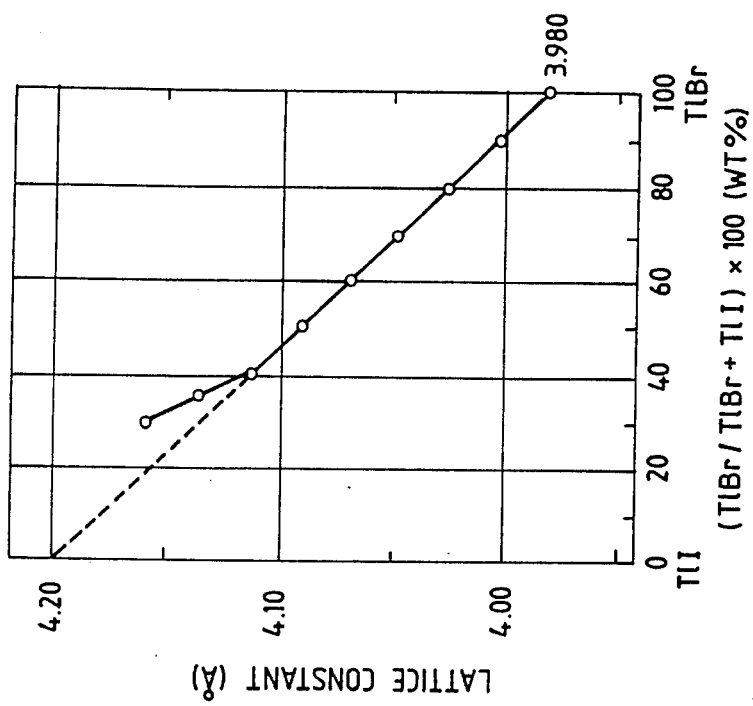
FIG. 4 is a graph showing the relation between lattice constant of a mixed crystal of thallium bromide and thallium iodide and content of TlBr in the crystal.

FIG. 4 is a graph showing the lattice constant, a, of crystals of thallium bromide and thallium iodide in relation to the crystal composition. When the content of thallium bromide is from 30 to 100 wt%, the crystal is of a cubic system. With thallium bromide itself, a=3.98 angstrom. Thallium iodide itself is of a cubic system at high temperatures, with a=4.20 angstrom. The lattice constant changes, in relation to the mixing ratio, along the line obtained by connecting the above two values. More particularly, the crystals which contain from 0 to 38 wt% of thallium bromide suffer the influence of the thallium iodide crystalline system which is stable at room temperature. As a result, they have a larger lattice constant than as expected. Although the crystals are of a cubic system, they involve internal strain, so that when such crystals are converted to fibers, the transmittance and high power transmission capacity are adversely influenced. Accordingly, the content of thallium bromide should be 40 wt% or higher.

The tensile strength of the mixed crystal fiber has a peak when the content of thallium bromide is in the range of from 40 to 45 wt% except for the fiber of thallium iodide itself. Although a fiber comprising 80 to 90 wt% of thallium bromide has a high tensile strength, plastic deformation occurs when the fiber is bent, and it remains bent and does not return to the original state by elasticity. From this, it will be appreciated that when the content of thallium bromide is in the range of from 40 to 80 wt%, the resulting fiber exhibits elastic deformation and produces a repulsion force against bending. No breakage or cracking is produced on bending.

Next, fibers are produced from compositions having a limited range of the thallium bromide content, i.e. 36 to 50 wt%, in order to determine a critical radius curvature.

Figure 5:
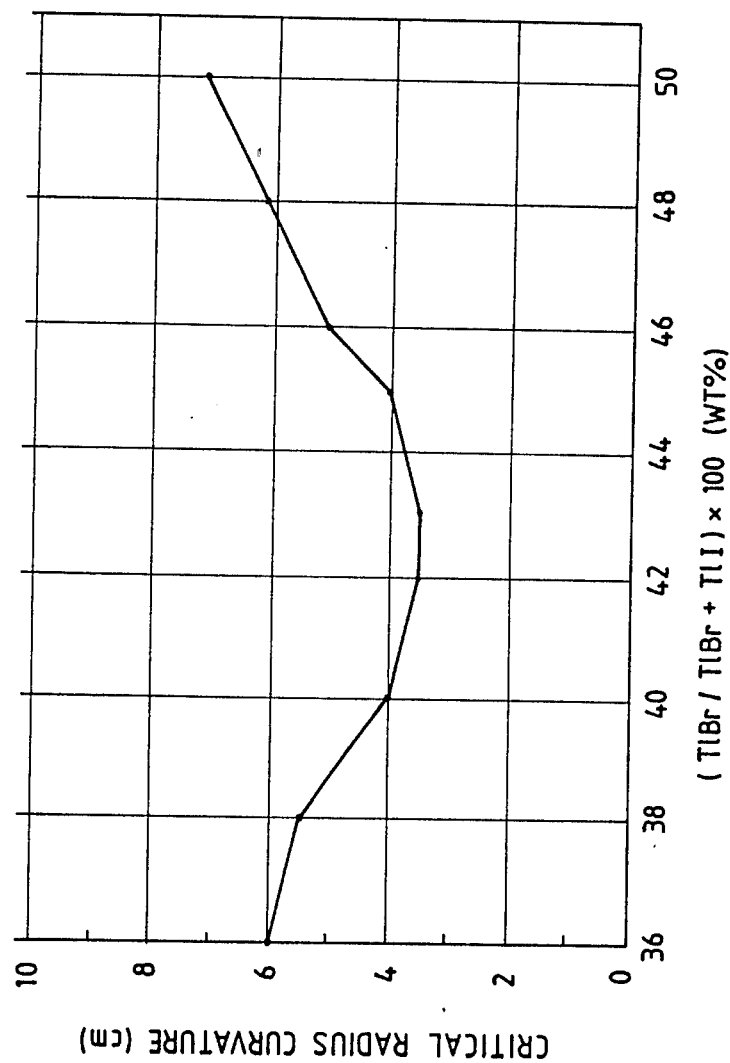
FIG. 5 is a graph showing the relation between critical curvature radius and content of thallium bromide in a mixed crystal of thallium bromide and thallium iodide.

There is provided a plastic sheet having concentrically arranged grooves in the form of a circle. Each fiber is set in the grooves according to the circle diameter in order to determine a radius curvature at the breakage of a tested fiber. The results are shown in FIG. 5. The critical radius curvature will be found to be below 4 cm when the content of thallium bromide is in the range of from 40 to 45 wt%, ensuring adequate flexibility as fibers. Less contents are unfavorable because of the poor transmittance as shown in FIG. 3. Larger amounts result in larger radius curvature, which means poor flexibility.

Gathering the foregoing, the thallium bromide and thallium iodide composition which is optimum for use as fibers should comprise 40 to 45 wt% of thallium bromide.

In practice, the fibers obtained from the composition should preferably have a diameter of from 0.3 to 1 mm.

Even though optical fibers are prepared from the above composition, the infrared transmission capacity is greatly influenced by the presence of impurities contained in the fiber and the size of the impurities.

In order to impart high transmission power capacity to fibers, it is essential to make crystals which are highly pure and substantially free of any defects. To this end, starting materials should have a purity not less than 99.9%. Optical fibers for infrared radiation deteriorate or even melt by generation of heat ascribed to the presence of impurities in the fiber. The impurities will also bring about crazing and/or voids in the fiber, leading to a lowering of transmittivity.

Even if the above defects are removed, optical fibers have sometimes wale-like defects on the surface thereof. These defects cause the fiber to deteriorate within a short time. To avoid this, the fiber should preferably be finished so that the surface roughness is below 0.2 $\mu$m.

Turning now to the impurities contained in optical fibers, it is necessary that impurities in the starting materials be reduced and that no impurity particle having a size not smaller than 1 $\mu$m exists in the fiber.

Impurities which are ordinarily contained in thallium halides are oxides of Si, Al, Fe, Zn and Mg. If these impurities having a size of several to several tens $\mu$m are contained in the fiber, they serve to absorb laser beams, whereupon heat is generated from the impurities and the fiber will deteriorate and even melt.

Figure 6:
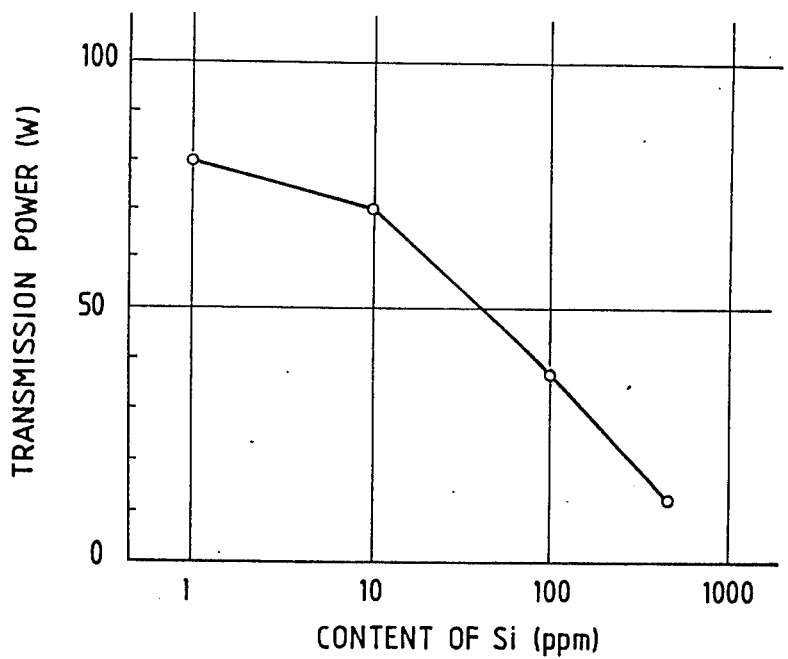
FIG. 6 is a graph showing the relation between power transmission capacity and content of Si impurity.

In order to confirm the adverse influences of impurities, a KRS-5 fiber having a diameter of 0.5 mm and a length of 1.5 m is incorporated with $SiO_2$ impurity in different amounts by a procedure in which the impurity is deposited on zone-purified crystals and then the crystals are extruded. The fiber is tested to determine a $CO_2$ laser transmission capacity according to the following procedure. The $CO_2$ laser beam is focussed to a diameter of about 0.35 mm using a ZnSe lens and is then transmitted from one polished end of the fiber to another end. The output power is measured by a power meter (e.g. 201, by Coherent Co., Ltd.) The results are shown in FIG. 6, revealing that when the content of $SiO_2$ impurity exceeds 10 ppm, the transmission capacity lowers sharply. Similarly, other element impurities are used to determine lowerings of the transmission capacity. The results are shown in the Table below.

| Element Concentration | Si | Al | Fe | Mg |
| --- | --- | --- | --- | --- |
| 10 ppm | 70W | 70W | 70W | 60W |
| 100 ppm | 30W | 30W | 20W | 30W |

As will be clear from the above results, the content of impurities should be suppressed to a level of 10 ppm or less.

When a $CO_2$ laser beam is passed into a KRS-5 fiber having a diameter of 0.5 mm and a length of 1.5 m and the output power is raised every minute, the fiber melts locally and produces wale-like defects on the fiber surface. These defects lower the transmittivity to a substantial extent. If the power is further raised, the fiber deteriorates completely, making it impossible to transmit the laser beam.

Figure 7:
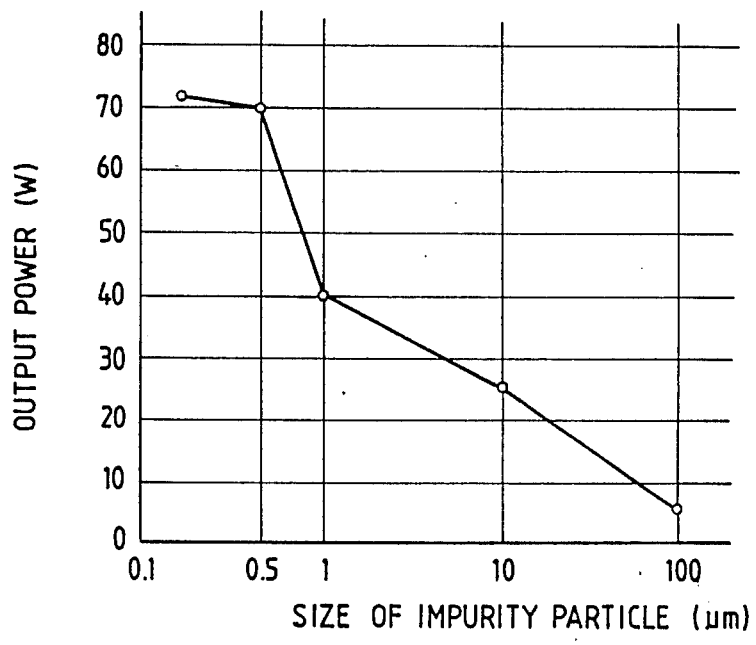
FIG. 7 is a graph showing the relation between output power and particle size of an impurity.

The X-ray microanalysis of the defect portions reveals that impurities such as metal oxides indicated before exist and that the output power deterioration depends largely on the size of the impurity. The relation between the output power and the impurity size is shown in FIG. 7. As will be clearly seen from the figure, the particles having a size up to 1 $\mu$m, preferably up to 0.5 $\mu$m, are acceptable.

Thus, it is important to limit the total amount of impurities and to remove particles, such as metal oxides, having a size not smaller than 1 $\mu$m. The limitation of the total impurity content is attained by using starting materials having a purity of 99.9% or higher. The removal of large-size particles is possible by known techniques such as vacuum distillation or capillary filtration.

The fiber of the present invention is made of a mixed crystal of 40 to 45 wt% of thallium bromide and the balance of thallium iodide, has a reduced content of impurities, and is free of any impurities having a size not smaller than 1 $\mu$m. A fiber having a diameter of 0.5 mm and a length of 1.5 mm, which satisfy the above requirements, is made and subjected to a continuous test in which a $CO_2$ laser beam is focussed using a ZnSe lens having a focal point of 6 cm and passed into the fiber under conditions of 100 W for 10 hours, with success. Instead of the $CO_2$ laser, a CO laser beam may be used with similar results.

The optical fiber of the invention has a number of advantages over prior art counterparts, and if this fiber is applied as a laser scalpel, the spot diameter can be reduced to 0.3 mm, enabling due to conduct a delicate operation as desired.

What is claimed is:

1. An optical fiber which is able to transmit infrared energy of high power and is flexible and long in life, said fiber consisting essentially of a mixed crystal of 40 to 45 wt% of thallium bromide and the balance of thallium iodide, each having a purity not less than 99.9%, said fiber being free of any particles having a size not smaller than 1 $\mu$m.

2. An optical fiber according to claim 1, wherein said fiber is free of particles having a size not smaller than 0.5 $\mu$m.

3. An optical fiber according to claim 1, wherein a total content of impurities is 10 ppm or less.

4. An optical fiber according to claim 1, wherein said fiber is polished to a surface roughness of 0.2 $\mu$m or below.

5. An optical fiber according to claim 1, wherein the optical fiber is capable of transmitting infrared energy from a $CO_2$ or CO laser.

6. An optical fiber according to claim 1, wherein said optical fiber has a diameter of from 0.3 to 1 mm.

7. An optical fiber according to claim 1, wherein said optical fiber is used as a laser scalpel.

* * * * *